United States Patent
Ali et al.

(10) Patent No.: US 9,425,188 B2
(45) Date of Patent: Aug. 23, 2016

(54) ACTIVE ESD PROTECTION CIRCUIT WITH BLOCKING DIODE

(71) Applicant: Texas Instruments Incorporated, Dallas, TX (US)

(72) Inventors: Muhammad Yusuf Ali, Allen, TX (US); Rajkumar Sankaralingam, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 28 days.

(21) Appl. No.: 14/494,316

(22) Filed: Sep. 23, 2014

(65) Prior Publication Data

US 2015/0085409 A1   Mar. 26, 2015

Related U.S. Application Data

(60) Provisional application No. 61/882,848, filed on Sep. 26, 2013.

(51) Int. Cl.
| | |
|---|---|
| H02H 1/00 | (2006.01) |
| H02H 1/04 | (2006.01) |
| H02H 3/22 | (2006.01) |
| H02H 9/04 | (2006.01) |
| H01L 27/02 | (2006.01) |

(52) U.S. Cl.
CPC .................................. *H01L 27/0285* (2013.01)

(58) Field of Classification Search
USPC .......................................................... 361/56
See application file for complete search history.

(56) References Cited

U.S. PATENT DOCUMENTS

| | | | | |
|---|---|---|---|---|
| 6,963,112 B2* | 11/2005 | Chen | ................... | H01L 27/0266 |
| | | | | 257/357 |
| 7,061,737 B2* | 6/2006 | Chen | ................... | H01L 27/0285 |
| | | | | 361/111 |
| 7,746,608 B2* | 6/2010 | Hung | ..................... | H02H 9/046 |
| | | | | 257/355 |
| 8,169,761 B2* | 5/2012 | Yeh | ..................... | H01L 27/0266 |
| | | | | 361/111 |
| 8,659,859 B1* | 2/2014 | Zhu | ....................... | H02H 9/046 |
| | | | | 361/111 |
| 2005/0078419 A1 | 4/2005 | Stockinger et al. | | |
| 2008/0088994 A1* | 4/2008 | Lai | ...................... | H01L 27/0262 |
| | | | | 361/56 |
| 2009/0296293 A1* | 12/2009 | Ker | ..................... | H01L 27/0251 |
| | | | | 361/56 |
| 2013/0285113 A1 | 10/2013 | Edwards | | |

* cited by examiner

*Primary Examiner* — Dharti Patel
(74) *Attorney, Agent, or Firm* — Daniel Chan; Frank D. Cimino

(57) ABSTRACT

An electrostatic discharge (ESD) protection integrated circuit (IC) includes a substrate having a semiconductor surface, a high power supply rail (VDD) and a low power supply rail (VSS) on the semiconductor surface. A trigger circuit including at least one trigger input and at least one trigger output is coupled between VDD and VSS. An active shunt including at least a large MOSFET is coupled between VDD and VSS. The trigger output is coupled to a gate electrode of the large MOSFET, and at least one diode or diode connected transistor (blocking diode) is coupled between VDD and the trigger circuit, within the trigger circuit or between the trigger output and gate electrode.

14 Claims, 2 Drawing Sheets

ACTIVE ESD PROTECTION CIRCUIT WITH BLOCKING DIODE

CROSS REFERENCE TO RELATED APPLICATIONS

This application claims the benefit of Provisional Application Ser. No. 61/882,848 entitled "Dual-Drive ActiveFET ESD Cell" filed Sep. 26, 2013, which is herein incorporated by reference in its entirety.

FIELD

Disclosed embodiments relate to electrostatic discharge (ESD) circuitry and more specifically to an integrated circuit including ESD circuitry for protecting its Input/Output (I/O) and power supply pins.

BACKGROUND

Modern high-density integrated circuits (ICs) are known to be vulnerable to damage from the electrostatic discharge (ESD) from a charged body (human or otherwise) as the charged body physically contacts the IC. ESD damage occurs when the amount of charge exceeds the capability of the electrical conduction path through the IC. The typical ESD failure mechanisms include thermal runaway resulting in junction shorting, and dielectric breakdown resulting in gate-junction shorting in the metal-oxide-semiconductor (MOS) context.

An IC may be subjected to a damaging ESD event in the manufacturing process, during assembly, testing, or in the system application. In conventional IC ESD protection schemes, active clamp circuits are generally used to shunt ESD current between the power supply rails and thereby protect internal IC element nodes that are connected to bond pads from ESD damage.

One type of active ESD clamp circuit, known as an active Metal Oxide Semiconductor Field Effect Transistor (MOSFET) cell (active FET ESD cell), typically includes a trigger circuit coupled between the power supply rails that has a trigger output that couples to a gate of at least one large area MOSFET clamp transistor which acts as a shunting circuit being in parallel to the pin(s) being protected when triggered ON. The conduction of the clamp transistor(s) is controlled by the trigger circuit.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include electrostatic discharge (ESD) protection circuits that include one or more blocking diodes which improve the drive and help sustain the gate voltage for the large area MOSFET (large MOSFET) of an active shunt. This arrangement has been found to allow a reduction in the size of the large MOSFET while providing the same low ON resistance which enables a more area efficient ESD solution compared to conventional ESD protection circuits.

One embodiment comprises an active ESD protection circuit (ESD protection circuitry) including a substrate having a semiconductor surface, a high power supply rail (VDD) and a low power supply rail (VSS) on the semiconductor surface. A trigger circuit including at least one trigger input and at least one trigger output is coupled between VDD and VSS. An active shunt including at least a large MOSFET is coupled between VDD and VSS. The trigger output is coupled to a gate electrode of the large MOSFET, and at least one diode or diode connected transistor (blocking diode) is coupled between VDD and the trigger circuit, within the trigger circuit itself, or between the trigger output and the gate electrode of the large MOSFET.

BRIEF DESCRIPTION OF THE DRAWINGS

Reference will now be made to the accompanying drawings, which are not necessarily drawn to scale, wherein.

DETAILED DESCRIPTION

Figure 1A:
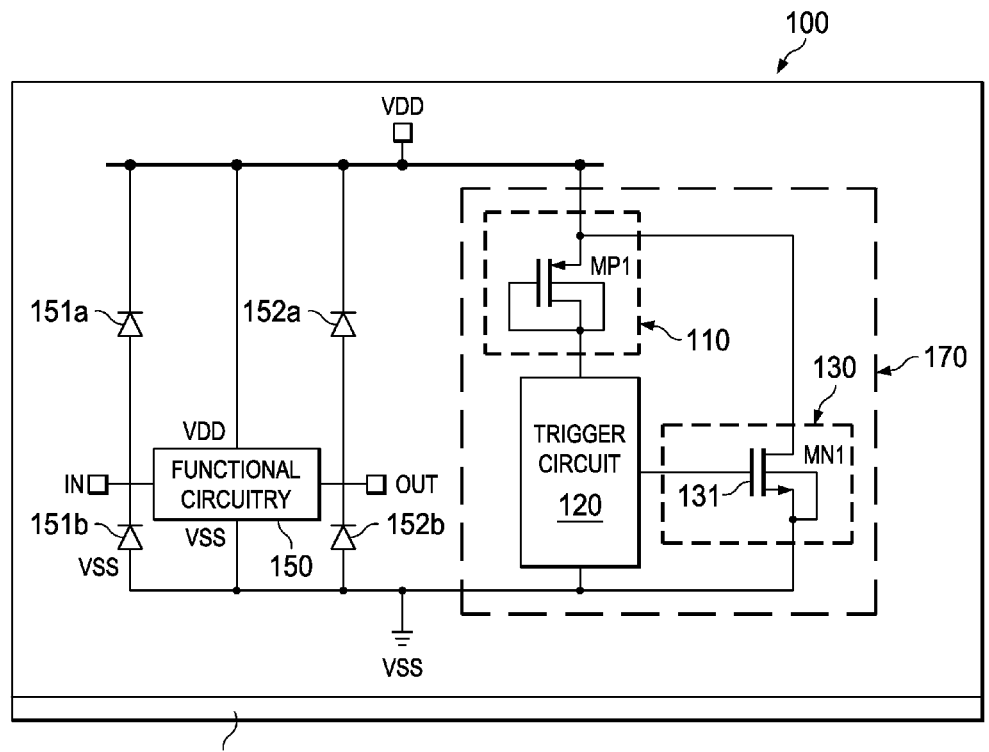
FIG. 1A is a schematic diagram of an ESD protected integrated circuit (IC) formed on a substrate including example active ESD protection circuitry including a blocking diode, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

FIG. 1A is a schematic diagram of an ESD protected IC 100 formed on a substrate 105 having a semiconductor surface including example ESD protection circuitry 170 having a blocking diode or diode connected transistor (blocking diode) 110 shown as MP1, according to an example embodiment. ESD protection circuitry 170 also includes a trigger circuit 120, and an active shunt 130 including at least one large MOSFET shown as MN1 131 that functions as an ESD shunting circuit with a desired low ON-resistance for protecting the VDD pad and optionally also having at least one input/output pin of the functional circuitry 150 shown as an IN pad and an OUT pad directly coupling to input(s) of the trigger circuit 120 (see FIG. 1B described below). Although an NMOS transistor is shown for the large MOSFET of active shunt 130 and a PMOS transistor for the blocking diode 110, NMOS or PMOS transistor(s) can be used for either.

The functional circuitry 150 is connected by a VDD pad to VDD and by a VSS pad to VSS and has a plurality of external terminals, by way of which functional circuitry 150 carries out its function. For simplicity only IN and OUT pads are illustrated in FIG. 1A which operate as common input and output terminals, respectively, by way of which functional circuitry 150 can receive incoming signals and can generate outputs, as well known in the art. Functional circuitry 150 realizes and carries out desired functionality of ESD protected IC 100, such as that of a digital IC (e.g., digital signal processor (DSP)) or analog IC (e.g., amplifier or power converter). The capability of functional circuitry provided by ESD protected IC 100 may vary, for example ranging from a simple device to a complex device. The specific functionality contained within functional circuitry 150 is not of importance to disclosed embodiments. The OUT pad is shown including primary diode protection provided by diodes 152a and 152b to VDD and VSS, respectively, and the IN pad is shown including primary diode protection provided by diodes 151a and 151b to VDD and VSS, respectively.

MN1 131 or other large MOSFET in the active shunt 130 typically has an area that is typically at least 5 times that of any other devices within ESD protection circuitry 170 including the blocking diode 110 shown. In this embodiment the trigger circuit 120 is decoupled from the stress pin shown in FIG. 1A as VDD by the blocking diode 110 to provide an area efficient active FET-based ESD solution.

The substrate 105 and/or its semiconductor surface can comprise silicon, silicon-germanium, or other semiconductor material. One particular arrangement is p− epi on a p+ substrate. Another particular arrangement is a silicon/germanium (SiGe) semiconductor surface on a silicon substrate.

Blocking diode 110 in the case of transistors can comprise BJT(s) or MOS transistor(s), and in the case of diodes can comprise conventional diodes, Schottky or Zener diodes. Blocking diode 110 can also comprise mixed diode connected transistors and diodes.

The blocking diode 110 is shown as a diode connected PMOS transistor labeled MP1 connected between the VDD rail and the high side of the trigger circuit 120, where the low side of the trigger circuit 120 is connected to VSS. The trigger circuit 120 includes at least one trigger input typically generated from VDD which is coupled to provide the trigger input shown in FIG. 1A, and at least one trigger output 120b that is shown coupled to a gate electrode of MN1 131 of active shunt 130.

The blocking diode 110 provides a plurality of different functions for the ESD protected IC 100. The blocking diode 110 provides a path to trigger the active shunt 130 shown as MN1 131 when driven from the stress pad shown as VDD in FIG. 1A. The blocking diode 110 also prevents early discharge of MN1 131 depending on its size (area), so that the turn-ON voltage of the ESD protection circuitry 170 can either have a monotonically increasing behavior or a snapback-like behavior, where the size of the blocking diode 110 can tune the trigger voltage level of the snapback-like behavior. If the size of the blocking diode 110 is made small enough, the blocking diode 110 can provide a relatively high trigger voltage which can be leveraged for transient noise immunity.

The trigger circuit 120 can generally comprise a wide variety of trigger circuit arrangements and components which can comprise a plurality of trigger elements (see FIGS. 3A and 3B described below). The purpose of the trigger circuit 120 is to quickly turn ON MN1 131 or other large MOSFET in the active shunt 130 during an ESD stress event. Trigger circuit 120 can include in one specific embodiment a slew rate detector, a pull-up circuit, a current source, a pull-down stage, a reset stage, and an output stage. The trigger circuit 120 can also comprise a level detector that can turn ON MN1 131 or other large MOSFET based on the ESD pulse level.

Besides VDD, ESD protected IC 100 also ESD protects IN and OUT. Assume an ESD pulse is received at IN or OUT. Diode 152a for an ESD pulse at IN or diode 151a for an ESD pulse at OUT conducts the pulse to VDD which is then conducted by the ESD protection circuitry 170 first by the blocking diode 110 which provides a trigger input to turn ON the trigger circuit 120 that provides a trigger output having a gate voltage sufficient to turn ON MN 131 to dissipate the ESD pulse energy to VSS.

Figure 1B:
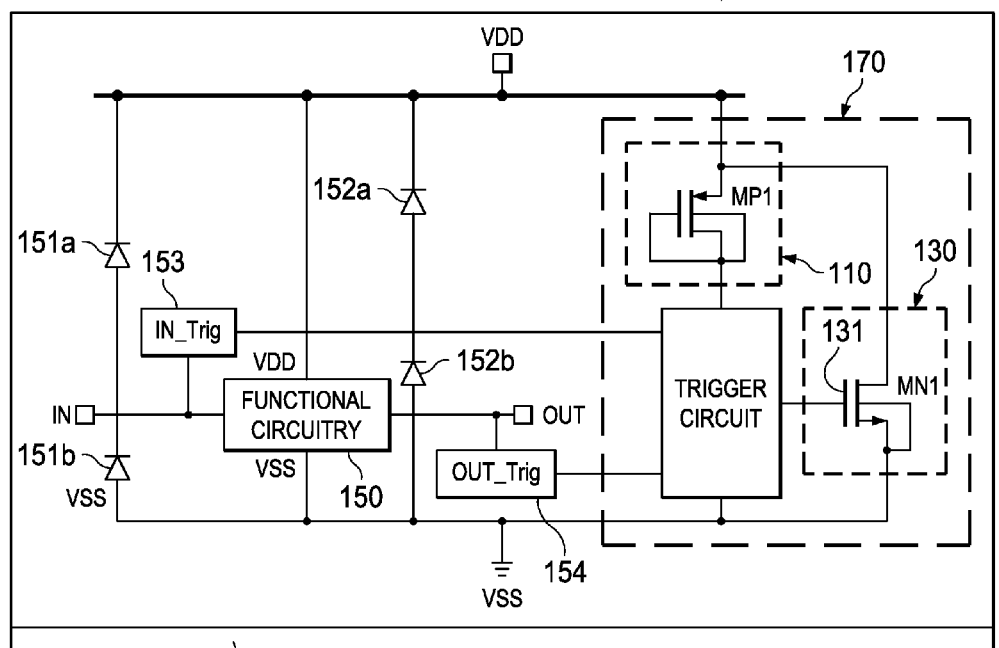
FIG. 1B is a schematic diagram of ESD protected IC formed on a substrate including example active ESD protection circuitry including a blocking diode and optional connectivity coupling IN/OUT of the functional circuit to inputs of the trigger circuit in the ESD protection circuit through trigger elements, according to an example embodiment.

FIG. 1B is a schematic diagram of ESD protected IC 160 formed on a substrate 105 including example active ESD protection circuitry 170 including a blocking diode 110 further comprising optional connectivity coupling from IN and OUT to the trigger circuit 120 through trigger elements shown as IN_Trig 153 and OUT_Trig 154. IN_Trig 153 and OUT_Trig 154 can generally be any circuit element(s) that couples IN or OUT to the trigger circuit 120, such as a diode or transistor. ESD protected IC 160 thus provide multi-drive capability so that triggering of the trigger circuit 120 can be from either IN, OUT or a power supply pin to provide an area efficient ESD protection solution that enables the same ESD protection circuitry 170 to be used for independent ESD protection of several pins including at least one I/O pin.

Figure 2:
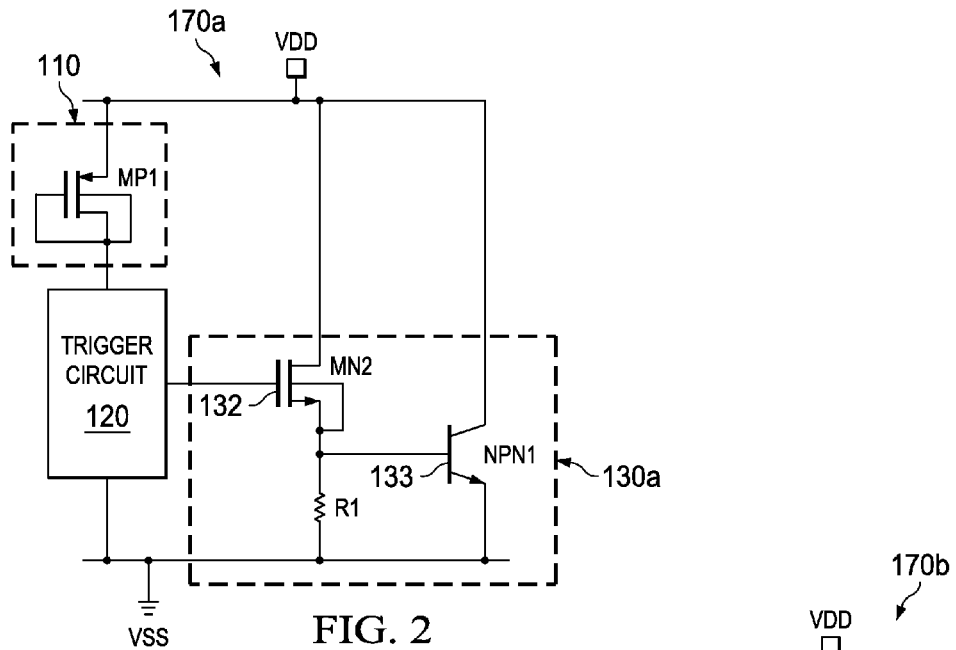
FIG. 2 is a schematic diagram of example ESD protection circuitry including a blocking diode and an active shunt including a bipolar junction transistor (BJT), according to an example embodiment.

FIG. 2 is a schematic diagram of example ESD protection circuitry 170a including a blocking diode 110 and an active shunt 130a comprising a BJT NPN1 133 (BJT 133) connected between VDD and VSS, a driver MN2 132 coupled to provide base current to the BJT 133, and a resistor shown as R1 between the base and emitter of BJT 133, according to an example embodiment. This embodiment can also be used to decouple the trigger circuit 120 from the stress pin(s) to provide an area efficient active bipolar ESD cell. In this case, the blocking diode 110 helps to sustain the gate voltage of MN2 132 which provides the base current for BJT 133 to keep it ON for the full duration of the ESD pulse. Since BJTs can have higher driving capability as compared to MOSFETs, this configuration can be used to reduce the ESD cell size further.

Figure 3A:
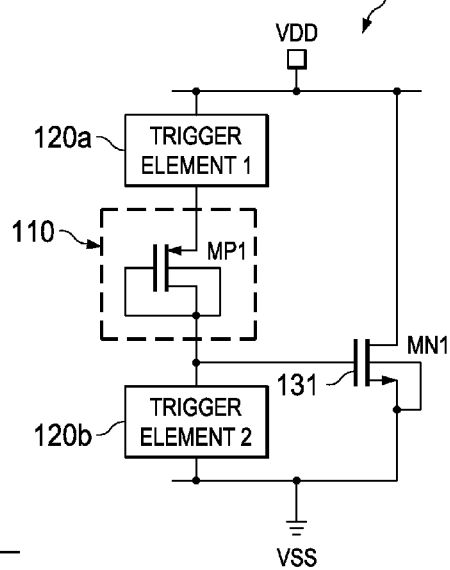
FIG. 3A is a schematic diagram of example ESD protection circuitry including a blocking diode inside the trigger circuit in a first position of the active ESD protection circuitry, according to an example embodiment.

FIG. 3A is a schematic diagram of example ESD protection circuitry 170b including a blocking diode 110 inside the trigger circuit shown in series between trigger element 1 120a and trigger element 2 120b of an active FET ESD cell, according to an example embodiment. The position of the blocking diode 110 shown as MP1 can be changed and it can be incorporated inside the trigger circuit in a way that will block the path for MN1 131 to discharge through the VDD bus.

Figure 3B:
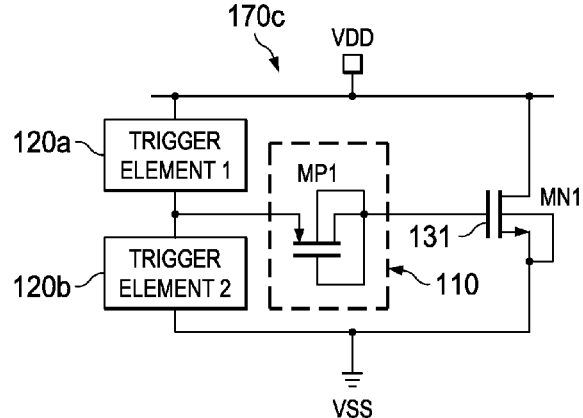
FIG. 3B is a schematic diagram of an example ESD protection circuitry including a blocking diode inside the trigger circuit in a different location compared to that shown in FIG. 3A, according to an example embodiment.

FIG. 3B is a schematic diagram of example ESD protection circuitry 170c including a blocking diode 110 shown as MP1 inside the trigger elements 120a and 120b of the trigger circuit, according to an example embodiment. The placement of blocking diode MP1 110 shown in FIG. 3B will lead to more area efficient design since it prevents MN1 131 from discharging through both high-side and low-side paths when the trigger elements 120a and 120b are ON.

Disclosed embodiments can be used to form semiconductor IC die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. An electrostatic discharge (ESD) protection circuit, comprising:
   a voltage supply rail;
   a blocking diode having a first terminal connected directly to the voltage supply rail and a second terminal free of being connected to the voltage supply rail;
   a functional circuitry including an input/output (IO) pad;
   an IO trigger circuit connecting to the IO pad and independent of the voltage supply rail;
   a trigger circuit including: a first trigger input connected to the IO pad via the IO trigger circuit, a second trigger input connected to the second terminal of the blocking diode, and a trigger output; and
   a shunt transistor including: a current electrode coupled to the voltage supply rail, and a control electrode coupled to the trigger output.

2. The ESD protection circuit of claim 1, wherein:
   the voltage supply rail includes a VDD voltage supply rail;
   the blocking diode includes a PMOS transistor having a source electrode connected to the VDD voltage supply rail, a drain electrode connected to the second input of the trigger circuit, and a gate electrode connected to the drain electrode.

3. The ESD protection circuit of claim 1, wherein the shunt transistor includes a bipolar transistor having a base electrode as the control electrode, and a collector electrode as the current electrode.

4. The ESD protection circuit of claim 1, wherein the shunt transistor includes a MOSFET having a drain electrode as the current electrode, and a gate electrode as the control electrode.

5. The ESD protection circuit of claim 1, wherein:
   the IO pad includes an input pad and an output pad independent of the input pad;
   the IO trigger circuit includes:
      an input trigger circuit connecting the input pad directly to the trigger circuit; and
      an output trigger circuit connecting the output pad directly to the trigger circuit; and
   the first and second trigger circuits are free of direction connection from the voltage supply rail.

6. The ESD protection circuit of claim 5, further comprising:
   a protection diode connecting the input pad to the voltage supply rail independent of the input trigger circuit.

7. The ESD protection circuit of claim 5, further comprising:
   a protection diode connecting the output pad to the voltage supply rail independent of the output trigger circuit.

8. The ESD protection circuit of claim 1, wherein the IO trigger circuit includes a trigger diode free of direct connection from the voltage supply rail.

9. An ESD protected integrated circuit (IC), comprising:
   a first supply rail;
   a second supply rail;
   a first trigger circuit having a first input coupled to the first supply rail and a first output free from direct connecting to the first and second supply rails;
   a second trigger circuit having a second input coupled to the second supply rail and a second output free from direct connecting to the first and second supply rails;
   a blocking diode coupled to the first and second outputs of the first and second trigger circuits, the blocking diode having a cathode and an anode free from connecting to the first and second supply rails; and
   a shunt transistor including a first current electrode coupled to the first supply rail, a second current electrode coupled to the second supply rail, and a control electrode coupled to the cathode of the blocking diode.

10. The ESD protected IC of claim 9, wherein the first supply rail includes a VDD supply rail, and the second supply rail includes a VSS supply rail.

11. The ESD protected IC of claim 9, wherein the blocking diode includes a PMOS transistor having:
   a source electrode connected to the first output of the first trigger circuit;
   a drain electrode connected to the second output of the second trigger circuit and the control electrode of the shunt transistor; and
   a gate electrode connected to the drain electrode.

12. The ESD protected IC of claim 9, wherein the blocking diode includes a PMOS transistor having:
   a source electrode connected to the first output of the first trigger circuit and the second output of the second trigger circuit;
   a drain electrode connected to the control electrode of the shunt transistor; and
   a gate electrode connected to the drain electrode.

13. The ESD protected IC of claim 9, wherein the shunt transistor includes an NMOS transistor having:
   a drain electrode as the first current electrode connected to the first supply rail;
   a source electrode as the second current electrode connected to the second supply rail; and
   a gate electrode as the control electrode connected to the cathode of the blocking diode.

14. The ESD protected IC of claim 9, wherein the shunt transistor includes an NPN bipolar transistor having:
   a collector electrode as the first current electrode connected to the first supply rail;
   an emitter electrode as the second current electrode connected to the second supply rail; and
   a base electrode as the control electrode connected to the cathode of the blocking diode.

* * * * *